United States Patent [19]

Anderson

[11] Patent Number: 4,725,743
[45] Date of Patent: Feb. 16, 1988

[54] TWO-STAGE DIGITAL LOGIC CIRCUITS INCLUDING AN INPUT SWITCHING STAGE AND AN OUTPUT DRIVING STAGE INCORPORATING GALLIUM ARSENIDE FET DEVICES

[75] Inventor: Carl J. Anderson, Montrose, N.Y.

[73] Assignee: International Business Machines Corporation, Armonk, N.Y.

[21] Appl. No.: 856,630

[22] Filed: Apr. 25, 1986

[51] Int. Cl.⁴ .................................. H03K 19/094
[52] U.S. Cl. ............................... 307/450; 307/448; 307/449
[58] Field of Search ............... 307/448, 450, 475, 449, 307/463, 443

[56] References Cited

U.S. PATENT DOCUMENTS

| | | | |
|---|---|---|---|
| 3,299,291 | 1/1967 | Warner, Jr. et al. | 307/448 |
| 3,678,293 | 7/1972 | Popper | 307/448 |
| 4,000,411 | 12/1976 | Sano et al. | 307/475 |
| 4,028,556 | 6/1977 | Cachier et al. | 307/450 |
| 4,038,563 | 7/1977 | Zuleeg et al. | 307/450 |
| 4,177,390 | 12/1979 | Cappon | 307/450 |
| 4,394,589 | 7/1983 | Pham et al. | 307/446 X |
| 4,395,645 | 7/1983 | Pernyeszi | 307/450 |
| 4,404,480 | 9/1983 | Ransom et al. | 307/475 |
| 4,405,870 | 9/1983 | Eden | 307/446 |
| 4,423,339 | 12/1983 | Seelbach et al. | 307/464 |
| 4,434,379 | 2/1984 | Bert | 307/448 |
| 4,438,351 | 3/1984 | Schuermeyer | 307/450 |
| 4,445,051 | 4/1984 | Elmasry | 307/450 |
| 4,477,884 | 10/1984 | Iwahashi et al. | 307/449 X |
| 4,485,316 | 11/1984 | Nuzillat et al. | 307/446 |
| 4,490,632 | 12/1984 | Everett et al. | 307/446 X |
| 4,514,649 | 4/1985 | Nuzillat et al. | 307/450 |

FOREIGN PATENT DOCUMENTS 58-145237 8/1983 Japan.

OTHER PUBLICATIONS

Yokoyama et al., "GaAs MOSFET High-Speed Logic"; Third (3rd) Int'l. Conf. on Solid-State Devices, Tokyo, JP., 1979, 17 pages.

Schuermeyer, "GaAs IGFET Digital Integrated Circuits", IEEE Trans. on Electron Devices, vol. ED-28, No. 5, pp. 541–545; 5/1981.

Schuermeyer et al., "GaAs IGFET: A New Device for High Speed Digital IC's"; Int'l. Electron Devices Meeting, 12/1980.

Schuermeyer et al., "Trap Studies on GaAs-$Si_3N_4$ Interfaces"; J. Vac. Sci. Technol., 19(3), Sep./Oct. 1981; pp. 421–426.

IEEE Int'l. Conf. Solid-State Circuits 2/15/78, "Low Power GaAs Digital ICs Using Schottky Diode-FET Logic", by R. C. Eden et al., pp. 68–69.

IEEE Journal of Solid-State Circuits, vol. SC-9, No. 5, Oct. 1974, pp. 269–276, "High-Speed Integrated Logic with GaAs MESFET's", by Van Tuyl et al.

IEEE Journal of Solid-State Circuits, vol. SC-11, No. 3, Jun. 1976, pp. 385–394, "A Subnanosecond Integrated Switching Circuit with MESFET's for LSI'"—Nuzillat et al.

(List continued on next page.)

Primary Examiner—Stanley D. Miller
Assistant Examiner—D. R. Hudspeth
Attorney, Agent, or Firm—Alvin J. Riddles; John J. Goodwin

[57] ABSTRACT

Digital logic driving stage circuitry is provided connected between ground and a single voltage with an enhancement mode type field effect transistor and a depletion mode type field effect transistor connected source to drain in series between the single voltage and ground. The gate of the enhancement mode type field effect transistor is the input of the logic signal and the gate of the depletion mode type field effect transistor is connected to ground, with the output at the connection between the transistors. A family of digital logic circuits is provided with circuit units made up of an enhancement mode logic input, depletion mode load circuitry stage and an enhancement mode input grounded source follower load driving stage.

5 Claims, 3 Drawing Figures

OTHER PUBLICATIONS

IEEE Electron Device Letters, vol. EDL-3, No. 8, Aug. 1982, pp. 197-199, "A GaAs Monolithic Frequency Divider Using Source Coupled FET Logic", by S. Katsu et al.

IEE Proc., vol. 127, Pt. 1, No. 5, (Oct. 1980), pp. 287-296, "Low Pinch-off voltage f.e.t. logic (l.p.f.l.): l.s.i. oriented logic approach using quasinonmally off GaAs m.e.s.f.e.t.s.", by Nuzillat et al.

IEEE Transactions on Electron Devices, vol. ED-26, No. 4, Apr. 1979, pp. 299-317, "The Prospects for Ultrahigh-Speed VLSI GaAs Digital Logic", by Eden et al.

IEEE Transactions on Electron Devices, vol. ED-29, No. 3, Mar. 1982, pp. 402-410, "The Effect of Logic Cell Configuration, Gatelength, and Fan-Out on the Propagation Delays of GaAs MESFET Logic Gates", by Namordi et al.

Electronics, (Oct. 9, 1980), pp. 76 & 78, "Gallium Arsenide to yield 5-GHz Divider", by K. Dreyfack.

IEEE Journal of Solid-State Circuits, vol. SC-12, No. 5, (Oct. 1977), "GaAs MESFET Logic with 4-GHz Clock Rate", by Van Tuyl et al.

Electronics, (Jun. 14, 1963), pp. 43-45, "Put More Snap in Logic Circuits With Field-Effect Transistors", by Csanky et al.

Electronics Letters, (4th Feb. 1982), vol. 18, No. 3, pp. 109-110, "High-Speed Two-Dimensional Electron-Gas FET Logic", by Tung et al.

TWO-STAGE DIGITAL LOGIC CIRCUITS INCLUDING AN INPUT SWITCHING STAGE AND AN OUTPUT DRIVING STAGE INCORPORATING GALLIUM ARSENIDE FET DEVICES

DESCRIPTION

Technical Field

The technical field of the invention is that of solid state electronics in the form of integrated circuitry for digital logic applications.

As the specifications in digital electronics become more rigid, the goal of incorporating increasingly greater circuit density on a single semiconductor chip becomes more difficult to achieve when the circuits themselves are complex and involve more component elements.

In a digital integrated circuit where the devices are assembled with very high density, there will be a small amount of chip area for each device which in turn requires a low power dissipation in each device, an extremely low dynamic switching energy, which further in turn is related to the reactance properties of the particular circuit and there is a requirement for high speed so as to achieve a very low signal propagation delay.

In order to satisfy these requirements in integrated circuits where the number of switching devices per chip is between 10,000 and 1,000,000, it is necessary that the circuits themselves become fundamentally simpler.

BACKGROUND ART

In general, efforts in the art to provide digital logic circuits for integrated circuitry have developed into a two stage type of circuit in which in a first stage, the logic portion of the circuit has the output thereof developed across a non-linear load which provides a very clear signal level in one signal direction and that signal level then actuates a second, driving stage which performs such functions as assisting in establishing the upper, lower and signal shape limits of the digital output signal and at the same time that driving stage provides sufficient power to achieve the speed in driving the types of loads associated with subsequent logic stages.

One illustration of the two stage type of digital logic circuit is in U.S. Pat. No. 4,028,556. In this circuit, in the first or logic stage, enhancement mode type field effect transistors with one electrode connected to ground are employed for the signal input devices for the digital logic variable signals and a depletion mode type field effect transistor with the gate thereof connected to the source is employed as the non-linear load. In the second or driving stage, two depletion mode type field effect transistors are connected with their sources and drains in series between two separate above and below ground voltages. The signal from the logic stage is introduced at the gate of one of the depletion mode devices. The second depletion mode field effect transistor is connected with the gate thereof connected to the below ground voltage. The output is taken from between the devices. In such a construction, a diode is needed to provide a signal level shift.

Another illustration of the two stage type of digital logic circuit is shown in U.S. Pat. No. 4,405,870. This circuit in the first stage employs Schottky diodes as digital logic variable input devices and uses a field effect transistor with the source and the gate connected as the non-linear load. The non-linear load transistor is connected to a negative voltage. A diode that provides a level shifting function is employed between the logic input devices and the load.

In the driving stage, two series source to drain connected field effect transistors are connected between ground and a positive voltage with the output taken between them, the gate of the one at the positive voltage is connected to the output and the logic stage output is connected to the gate of the field effect transistor connected to the ground voltage.

In each instance in the art, voltages on both sides of ground and level shifting is needed and the additional devices for level shifting make it more difficult to retain yield and meet the ever increasing device density requirements.

DISCLOSURE OF THE INVENTION

The invention provides an integrated circuit facilitating driving stage for a digital logic circuit. The invention further provides a family of digital logical circuits. The circuit of the invention operates between ground and a single voltage, requires no level shifting components and controls level and shape of the "off" signal.

Figure 1:
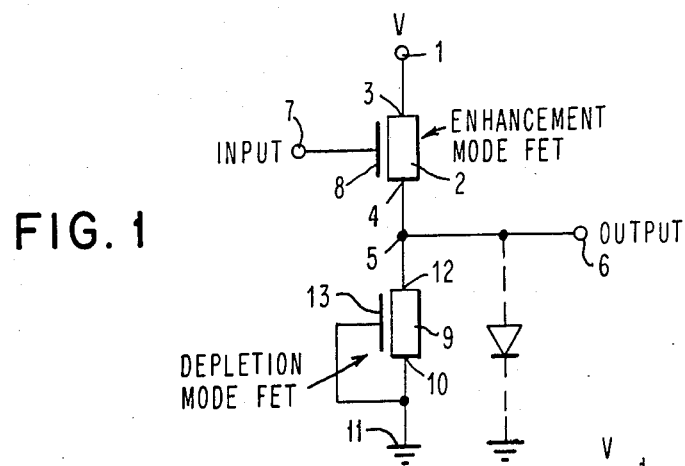
FIG. 1 is the driving stage circuit diagram.

In FIG. 1 a circuit diagram is provided that illustrates the improved driving stage of the invention. In FIG. 1 at a terminal 1 connected to the circuit voltage, an enhancement mode type field effect transistor 2 is connected with one ohmic electrode 3, such as the source electrode connected to terminal 1, and the other ohmic electrode 4, such as the drain electrode connected to a node 5 to which the output 6 is connected. A logic input signal is applied at terminal 7 which is connected to the gate 8 of the enhancement mode field effect transistor 2. A depletion mode type field effect transistor 9 having one ohmic electrode 10 thereof, such as the source electrode is connected to ground 11. The other ohmic electrode 12 such as the drain electrode is connected to the node 5. The gate 13 of transistor 9 is connected to ground 11.

The driving stage of the invention shown in FIG. 1 has features that differ from the conventional source/follower type digital logic signal amplification stage circuitry used heretofore in the art. One feature is that the logic input signal is introduced into the circuit through an enhancement mode type field effect transistor. The enhancement mode type field effect transistor has the characteristic that in the absence of a signal above the threshold is in the "off" condition. In the "off" condition, the enhancement mode type transistor 2 exhibits a high impedance which establishes the lower signal level of the circuit at the output 6 at a very precise value. In the "on" condition, the enhancement mode type transistor 2 exhibits a low impedance which establishes the higher signal level of the circuit at the output 6.

Another feature is that the depletion mode type field effect transistor 9 has the source 10 electrode thereof connected to the gate 13 and directly to ground 11. This performs two functions. The first is that the signal level at the output 6 is firmly established at ground. The second is in signal shaping in that when the logic input signal at 7 causes the enhancement mode type field effect transistor 2 to turn "off", the depletion mode type field effect transistor 9 with the source 10 and the gate 13 connected to ground 12 draws off all current and thereby compensates for any circuit reactance in subsequent circuitry connected to the output 6.

The driving stage of the invention achieves the advantages with the absolute minimum of components and voltages thereby improving yield in fabrication, higher density and the performance advantages of establishing a clear lower digital output signal level, compensation for subsequent circuit reactance properties, and the establishment of a clear maximum upper digital output signal level.

The driving stage output circuits of the type of the invention are usually connected in practice as an input to a subsequent logic stage circuit and the forward characteristic of a diode is employed to establish greater precision in the higher digital output signal. Where the subsequent logic circuit employs the gate of an FET transistor as an input location the gate to source or drain electrode is employed as such a diode. The diode is shown dotted in FIG. 1 between the output 6 and ground 11.

In accordance with the invention, the driving stage illustrated in connection with FIG. 1 when combined with digital logic circuitry employing enhancement mode type field effect transistors as digital logic variable input devices and employing a depletion mode transistor connected as a non-linear load provides a principle for a family of digital logical circuit units where switching in each stage is performed with an enhancement mode transistor and the load is performed with a depletion mode transistor providing both "on" and "off" signal level and shaping precision.

The combined logic and driving stage units will be illustrated employing a three input variable negative output signal logic circuit, known in the art as a "NOR", although in the light of the principles set forth, it will be apparent that various combinations of parallel and series variable inputs providing "and" and "or", and combinations thereof, logic functions through enhancement mode type field effect switches, can be assembled.

Figure 2:
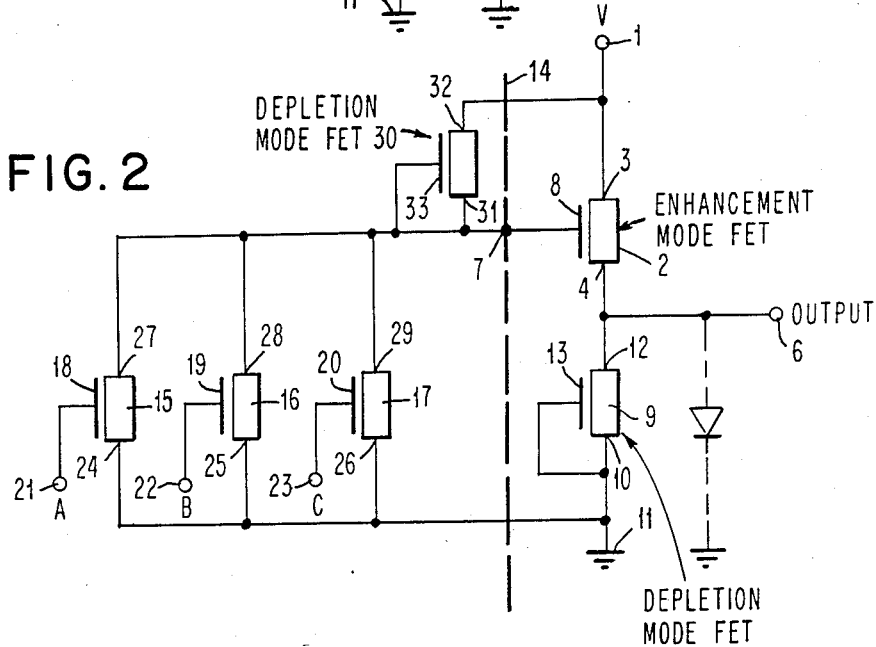
FIG. 2 is the logic stage and driving stage circuit diagram.

Referring next to FIG. 2, an illustration is provided of the cooperation between an enhance deplete mode type digital logic circuitry and the driving stage of FIG. 1 as a unit.

In FIG. 2 an imaginary line 14 shown dotted, separates the logic stage and the driving stage of the circuit. In the driving circuit portion the same numerals as in FIG. 1 are used. In the logic circuit there is provision for three independent digital logic variables A, B and C. The signal representing each logic variable in the "on" condition is greater than the threshold of the enhancement mode transistor to which it is applied. When a signal at any of A, B or C appears, the corresponding transistor turns "on" causing the signal level at the node 7 to move in the direction of ground.

Referring aqain to FIG. 2, three enhancement mode type field effect transistors 15, 16 and 17 are provided with gates 18, 19 and 20 for logic variables A, B and C, respectively, which in turn are to be applied to terminals 21, 22 and 23. The three enhancement mode type transistors 15, 16 and 17 each have their source electrodes 24, 25 and 26, respectively, connected to the ground at 12, and each have their drain electrodes 27, 28 and 29, respectively, connected to the node 7 which is the output of the logic portion and the input of the driving portion of the circuit. The level at the node 7 is established by the non-linear load which function is performed by the depletion mode type field effect transistor 30, having the drain electrode 31 thereof connected to the node 7, having the source electrode 32 thereof connected to the voltage 1 and having the gate 33 thereof connected to the node 7.

In operation, as a unit in a logic circuit family, the driving stage output 6 will be connected to the gate of a logic variable input of a subsequent stage, such as a gate of a transistor 15, 16 or 17 and the forward characteristic of the gate to source diode of the transistor establishes a precise higher digital signal level. That diode is schematically shown dotted between the output 6 and ground 11.

In the circuit of FIG. 2, in the no signal condition the transistors 15, 16 and 17 being enhancement mode type field effect transistors, in the absence of a positive signal exceeding the threshold at A, B or C are in the "off" or non-conducting condition. Since the three transistors 15, 16 and 17 provide, under these conditions, a high impedance, the voltage level at the node 7 is essentially at the power supply voltage level at terminal 1 since the depletion mode type transistor 30 is conducting. The power supply level at node 7 causes the enhancement mode transistor 2 to turn on raising the signal level at the output 6 to the upper digital level established by the forward characteristic of the gate to source diode, shown dotted, of the next circuit unit.

When a signal is present at any one of terminals 21, 22 or 23, it operates to turn the respective transistor "on", which causes the level at node 7 to move in the direction of ground to cause the enhancement mode transistor 2 to turn off. At this point, the transistor 9 serves as a current sink draining off any current resulting from reactance in subsequent logic circuit unit circuitry connected to the node 6 and permitting an abrupt drop to ground establishing the lower digital output level at the node 6.

BEST MODE FOR CARRYING OUT THE INVENTION

The circuit of FIG. 2 would be provided on a semi-insulating GaAs substrate. The depletion and enhancement mode devices would be formed by selective doping using such techniques as ion implantation. The voltage would be 1.5 volts.

The enhancement mode devices would have a threshold of +0.05 volts. The depletion mode devices would have a threshold of −0.65 volts. The gates may be formed by metal deposition over oxide.

Figure 3:
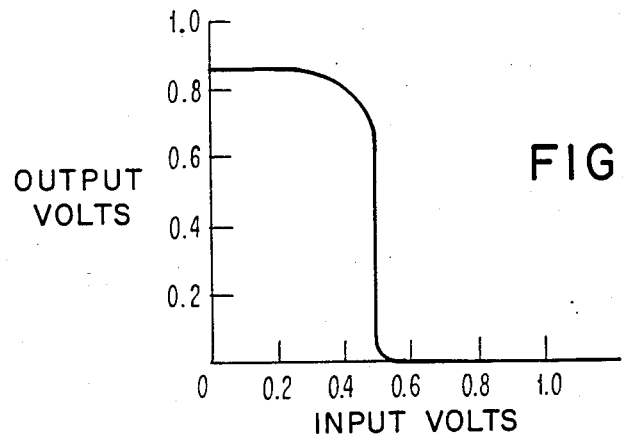
FIG. 3 is an input-output voltage characteristic curve of the circuit of FIG. 2.

Referring to FIG. 3, a curve of the output characteristic at node 6 illustrates the response in relation to an input at A, B or C. The potential at the output 6 would drop from 0.83 volts to essentially ground with the application of an input variable signal of the order of 0.83 volts.

What has been described is an improved driving circuit having advantages for integrated logic applications and family of logic circuit units wherein precise digital output signal levels are achieved with the minimum number of components and a single voltage.

Having thus described my invention, what I claim as new and desire to secure by Letters Patent is:

1. A logic circuit unit comprising in combination
   a logic input switching stage having an output terminal and at least one input terminal, a logic output driving stage having an input and an output terminal, said logic input switching stage having said output terminal thereof directly connected to said input terminal of said logic output driving stage, and said directly connected logic input switching stage and logic output driving stage being connected between voltage and ground, said logic input switching stage comprising at least one enhancement mode FET formed in gallium arsenide semiconductor material with said at least one input terminal thereof connected to the gate electrode of said at least one enhancement mode gallium arsenide FET, said logic output driving stage comprising an enhancement mode FET formed in gallium arsenide semiconductor material with said input terminal thereof connected to the gate terminal of said enhancement mode gallium arsenide FET, each said stage having a depletion mode FET formed in gallium arsenide semiconductor material having the source and gate thereof connected together serving as a load on each said enhancement mode gallium arsenide FET, said at least one input terminal connected to said gate electrode of said at least one enhancement mode FET in said logic input switching stage being responsive to a logic variable signal for producing an output signal on said output terminal of said logic output driving stage, said output terminal being connected at the point between said enhancement mode FET and said depletion mode FET load element in said logic output driving stage.

2. A logic circuit unit comprising in combination a logic stage connected between ground and a voltage comprising an enhancement mode logic switching input stage with an output node and including three enhancement mode field effect transistors connected source to drain in parallel between ground and said output node, and having a separate logic signal variable at each gate thereof and operable to change the voltage at said output node to the proximity of the ground voltage level in the presence of at least one logic input signal, said output node connected to the source electrode of a depletion mode field effect transistor and to the gate electrode of said depletion mode field effect transistor, the drain electrode of said depletion mode transistor being connected to said voltage, a driving stage connected between said voltage and ground including a depletion mode field effect transistor element having the source electrode and the gate electrode thereof connected to said ground, an enhancement mode field effect transistor element having one ohmic electrode thereof connected to said voltage, having the gate thereof connected to said output node of said logic stage and having the logic circuit unit output connected to the source electrode of said enhancement mode field effect transistor and to the drain electrode of said depletion mode field effect transistor.

3. The circuit unit of claim 2 wherein said enhancement mode transistor threshold voltage is +0.05 volts, said depletion mode transistor threshold voltage is −0.65 volts and said voltage is +1.5 volts.

4. The logic circuit unit of claim 2 wherein each said depletion mode type and said enhancement mode type field effect transistor is formed in gallium arsenide semiconductor material.

5. The logic circuit unit of claim 4 wherein said enhancement mode trnasistor threshold voltage is +0.05 volts, said depletion mode transistor threshold voltage is −0.65 volts and said voltage is +1.5 volts.

* * * * *